US008498832B2

(12) United States Patent
Venkatasubramanian

(10) Patent No.: US 8,498,832 B2
(45) Date of Patent: Jul. 30, 2013

(54) METHOD AND DEVICE FOR ASSESSING AND MONITORING VOLTAGE SECURITY IN A POWER SYSTEM

(75) Inventor: Vaithianathan Venkatasubramanian, Pullman, WA (US)

(73) Assignee: Schweitzer Engineering Laboratories Inc., Pullman, WA (US)

( * ) Notice: Subject to any disclaimer, the term of this patent is extended or adjusted under 35 U.S.C. 154(b) by 686 days.

(21) Appl. No.: 12/239,637

(22) Filed: Sep. 26, 2008

(65) Prior Publication Data

US 2009/0085407 A1 Apr. 2, 2009

Related U.S. Application Data

(60) Provisional application No. 60/976,324, filed on Sep. 28, 2007.

(51) Int. Cl.
*G01R 27/00* (2006.01)
*G01R 21/00* (2006.01)

(52) U.S. Cl.
USPC ................. 702/65; 702/57; 702/60; 700/291; 700/295

(58) Field of Classification Search
USPC .......................... 702/60, 57, 65; 700/291, 295
See application file for complete search history.

(56) References Cited

U.S. PATENT DOCUMENTS

| | | | | |
|---|---|---|---|---|
| 5,594,659 | A * | 1/1997 | Schlueter | 700/286 |
| 5,610,834 | A * | 3/1997 | Schlueter | 700/293 |
| 6,219,591 | B1 | 4/2001 | Vu | |
| 6,236,949 | B1 | 5/2001 | Hart | |
| 6,476,521 | B1 | 11/2002 | Lof | |
| 6,492,801 | B1 * | 12/2002 | Sims et al. | 324/142 |
| 6,662,124 | B2 | 12/2003 | Schweitzer | |
| 6,694,270 | B2 | 2/2004 | Hart | |
| 6,845,333 | B2 | 1/2005 | Anderson | |
| 7,480,580 | B2 | 1/2009 | Zweigle | |
| 7,630,863 | B2 | 12/2009 | Zweigle | |
| 7,660,649 | B1 * | 2/2010 | Hope et al. | 700/295 |
| 2003/0220752 | A1 | 11/2003 | Hart | |
| 2004/0059469 | A1 | 3/2004 | Hart | |
| 2004/0093177 | A1 | 5/2004 | Schweitzer | |
| 2005/0187726 | A1 | 8/2005 | Korba | |
| 2006/0030972 | A1 * | 2/2006 | Schlueter et al. | 700/292 |
| 2006/0224336 | A1 | 10/2006 | Petras | |
| 2007/0206644 | A1 | 9/2007 | Bertsch | |
| 2008/0074810 | A1 * | 3/2008 | Guzman-Casillas et al. | 361/20 |
| 2008/0077368 | A1 * | 3/2008 | Nasle | 703/4 |

OTHER PUBLICATIONS

A.P. Sakis Meliopoulos, George J. Cokkinides, Floyd Galvan, Bruce Fardanesh, Distributed State Estimator—Advances and Demonstration, Jan. 7, 2008.
Saman A. Zonouz and William H. Sanders, A Kalman-based Coordination for Hierarchical State Estimation: Algorithm and Analysis Jan. 7, 2008.

(Continued)

*Primary Examiner* — Sujoy Kundu
*Assistant Examiner* — Regis Betsch
(74) *Attorney, Agent, or Firm* — Eugene M. Cummings, PC

(57) ABSTRACT

Provided is a method and device for assessing and monitoring voltage security in a power system. More specifically, a method and device for assessing and monitoring the value of reactive power load when changes in reactive power outputs of at least some of the generators in the electrical power system cause all of the generators in the system to reach the combined operating limit of their reactive power output. In response thereto, the method and device are further adapted to initiate suitable control measures such as switching of transformer banks and/or capacitor/reactor banks, as well as shedding loads whenever necessary to mitigate an impending voltage stability problem.

27 Claims, 3 Drawing Sheets

OTHER PUBLICATIONS

Cold Load Pickup Issues, A Report to the Line Protection Subcommittee of the Power System Relay Committee of the IEEE Power Engineering Society, May 16, 2008.

P. Zhang, Measurement-Based Load Modeling, EPRI Electric Power Research Institute, Dec. 6, 2006.

* cited by examiner

METHOD AND DEVICE FOR ASSESSING AND MONITORING VOLTAGE SECURITY IN A POWER SYSTEM

CROSS-REFERENCE TO RELATED APPLICATIONS

This application claims benefit under 35 U.S.C. §119(e) of U.S. Provisional Application Ser. No. 60/976,324, entitled "METHOD AND DEVICE FOR ASSESSING AND MONITORING VOLTAGE SECURITY IN A POWER SYSTEM," filed Sep. 28, 2007, naming Vaithianathan Venkatasubramanian and Armando Guzman-Casillas as inventors, the complete disclosure thereof being incorporated herein by reference.

FIELD OF THE INVENTION

The present disclosure relates to a method and device for assessing and monitoring voltage security in a power system. More specifically, the method and device provides for the calculation of the value of reactive power load when changes in reactive power outputs of at least some of the generators in the electrical power system cause all of the generators on the system to reach the combined operating limit of their reactive power output.

BACKGROUND OF THE INVENTION

Voltage instability has played a major role in at least two of the recent major blackouts in North America, namely the Jul. 2, 1996 Western American blackout and the Aug. 14, 2003 Northeastern blackout. Voltage instability was encountered in these two blackouts because reactive power supplies such as generator reactive power outputs and shunt capacitor devices were exhausted ahead of the eventual blackouts.

Unlike active power, which can flow from sources to sinks over long transmission paths, reactive power must be supplied and balanced locally to meet the reactive power demands at load centers. Reactive power losses over transmission lines and transformers are typically several factors higher than active power losses. It is well known that voltage stability phenomena tend to be local while active power phenomena may involve geographically widespread operational domains. Although there is a breadth of theoretical analysis of voltage stability is relatively well understood, there exist only a few methods and devices for monitoring and mitigating voltage instability in a real-time operational environment.

The present description provides for the calculation of the value of reactive power load when changes in reactive power outputs of at least some of the generators in the electrical power system cause all of the generators on the system to reach the combined operating limit of their reactive power output.

These and other desired benefits of the preferred embodiments, including combinations of features thereof, will become apparent from the following description. It will be understood, however, that a process or arrangement could still appropriate the claimed invention without accomplishing each and every one of these desired benefits, including those gleaned from the following description. The appended claims, not these desired benefits, define the subject matter of the invention. Any and all benefits are derived from the multiple embodiments of the invention, not necessarily the description in general.

SUMMARY OF THE INVENTION

Provided is a method and device for assessing and monitoring voltage security in a power system. More specifically, a method and device is provided which calculates the value of reactive power load when changes in reactive power outputs of at least some of the generators in the electrical power system cause all of the generators in the system to reach the combined operating limit of their reactive power output. Such calculations may be performed by either a fast predictive QV margin calculator or a direct predictive QV margin calculator. The direct predictive QV margin calculator may be based in part on power-flow Jacobian computations.

In response thereto, the method and device are further adapted to initiate suitable control measures such as switching of transformer banks and/or capacitor/reactor banks, as well as shedding loads whenever necessary to mitigate an impending voltage stability problem. According to one aspect, the device further includes an apparatus (e.g., a load shedding apparatus) for reducing the reactive power load at one of the load distribution substations. In another aspect, the device further includes an apparatus for increasing or decreasing reactive power outputs of some of the generators.

A method for assessing and monitoring voltage stability in an electrical power system including a plurality of generators is further provided including the steps of acquiring phasor or Supervisory Control and Data Acquisition (SCADA) measurements from various locations on the power system; calculating a reactive power loading margin based on the acquired measurements; and calculating the value of reactive power load when changes in reactive power outputs of at least some of the generators in the electrical power system cause the plurality of generators to reach the combined operating limit of their reactive power output.

It should be understood that described herein are a number of different aspects or features which may have utility alone and/or in combination with other aspects or features. Accordingly, this summary is not an exhaustive identification of each such aspect or feature that is now or may hereafter be claimed, but represents an overview of certain aspects described herein to assist in understanding the more detailed description that follows. The scope of the invention is not limited to the specific embodiments described below, but is set forth in the claims now or hereafter filed.

DETAILED DESCRIPTION OF THE VARIOUS EMBODIMENTS OF THE PRESENT INVENTION

The method and device described herein are adapted to quantify the voltage security status of the operating condition of generators within an electrical power system. The method and device are further adapted to identify potential problem areas within the electrical power system that are prone to static voltage instability. More specifically, the device generally includes a reactive power loading margin calculator and a predictive reactive power load limit calculator for calculating the value of reactive power load when changes in reactive power outputs of at least some of the generators in the electrical power system cause all of the generators on the system to reach the combined operating limit of their reactive power output.

Figure 1:
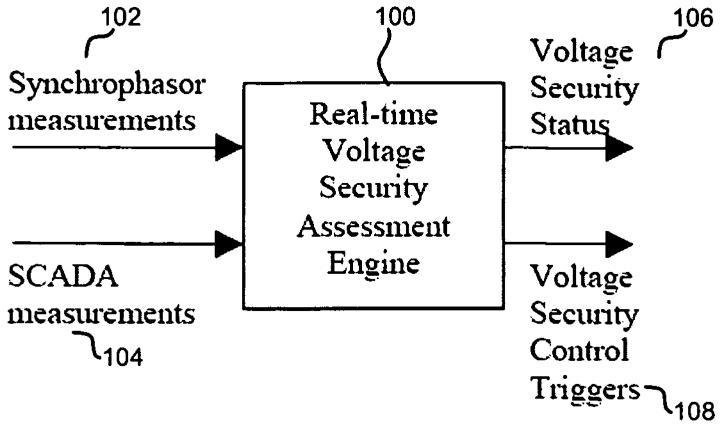
FIG. 1 is a general block diagram of voltage security processor.

FIG. 1 depicts a voltage security processor 100 for a) monitoring the status of voltage security of a power system, and b) initiating suitable control measures such as switching of transformer banks and/or capacitor/reactor banks, as well as shedding loads whenever necessary to mitigate an impending voltage stability problem. The voltage security processor 100 may be implemented into a power system device, an intelligent electronic device (IED), Synchrophasor Processor, Phasor Data Concentrator (PDC), Phasor Measurement Unit (PMU), Synchrophasor, protective relay, a computing device, or the like.

The voltage security processor 100 generally includes a reactive power loading margin calculator adapted to calculate a reactive power loading margin based on received phasor measurements 102 and/or SCADA measurements 104 acquired at various locations on the power system. The voltage security processor 100 also includes a predictive reactive power load limit calculator adapted to calculate the value of reactive power load when changes in reactive power outputs of at least some of the generators in the electrical power system cause all of the generators on the system to reach the combined operating limit of their reactive power output.

When the reactive power load falls below a select threshold, the voltage security processor 100 is further adapted to initiate specific control and/or monitoring actions. For example, the voltage security processor 100 may be adapted to provide a voltage security status signal 106 or trigger a voltage security control 108 in response thereto. In another example, the voltage security processor 100 may be further adapted to initiate suitable control measures such as switching of transformer banks and/or capacitor/reactor banks, as well as shedding loads whenever necessary to mitigate an impending voltage stability problem. According to one aspect, the voltage security processor 100 may be coupled to a device (e.g., a load shedding apparatus) for reducing the reactive power load at one of the load distribution substations. In another aspect, the voltage security processor 100 may be coupled to a device for increasing or decreasing reactive power outputs of some of the generators.

Figure 2:
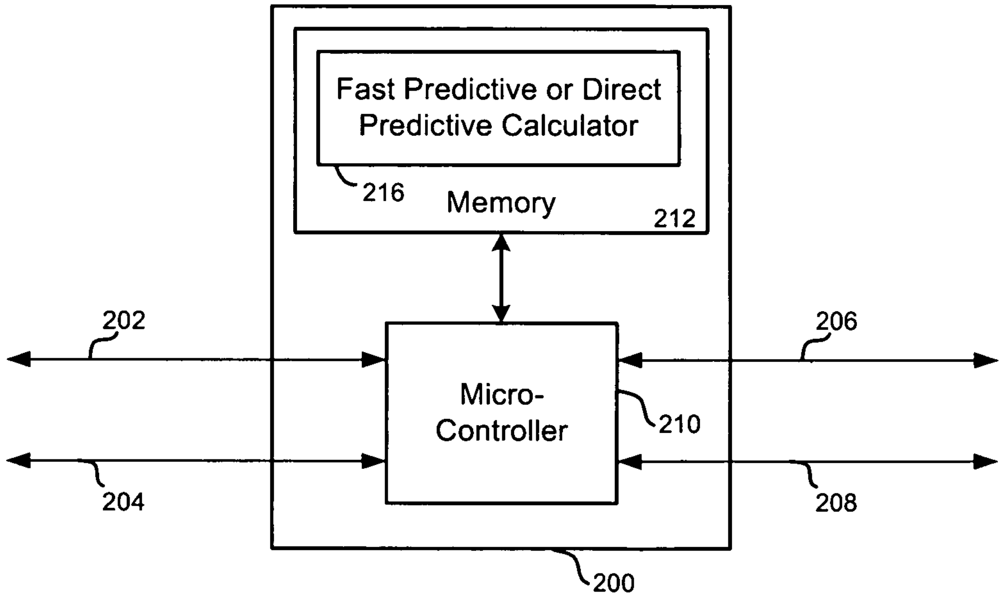
FIG. 2 is a general block diagram of the internal architecture of the voltage security processor of FIG. 1.

FIG. 2 illustrates an embodiment of the internal circuit architecture of the voltage security processor 100 of FIG. 1. The voltage security processor 200 generally includes a microcontroller 210 (e.g., a microprocessor, a field programmable gate array (FPGA), an application specific integrated circuit (ASIC) or the like), which is adapted to receive synchrophasor measurements 202 and/or SCADA measurements 204 from a location on the power system. The measurements may further be communicated via suitable communication link(s) (e.g., Ethernet communication link, wide area network (WAN), bidirectional serial communication links). Yet in another embodiment, the measurements may be communicated using a suitable communications protocol (e.g., the IEC 61850 communication protocol for fast communication messages among IEDs of different manufacturers within the network). Yet in another embodiment, all the communication links between the voltage security processor and other devices IEDs may be encrypted and secured through known encryption methods.

The voltage security processor 200 may further include a memory location 212 such as a FLASH, RAM or FPGA accessible by the microcontroller 210. The memory location 212 may include instructions for a fast predictive reactive power/voltage margin calculator and/or a direct predictive reactive power/voltage margin (i.e., a fast predictive QV margin calculator and/or a direct predictive QV margin calculator) calculator 216. For both calculators, the microcontroller 210 processes a reactive power loading margin according to the instructions stored in memory 212 upon receipt of synchrophasor measurements 202, and/or SCADA measurements 204. The value of reactive power load is also calculated when changes in reactive power outputs of at least some of the generators in the electrical power system cause all of the generators on the system to reach the combined operating limit of their reactive power output.

When the reactive power loading margin falls below a select threshold, the voltage security processor 200 is further adapted to initiate specific control and/or monitoring actions. For example, the voltage security processor 200 may be adapted to provide a voltage security status 206 or trigger a voltage security control 208 in response thereto. In another example, the voltage security processor 200 may be further adapted to initiate suitable control measures such as switching of transformer banks and/or capacitor/reactor banks, as well as shedding loads whenever necessary to mitigate an impending voltage stability problem. The voltage security processor 200 may be coupled to a device (e.g., a load shedding apparatus) for reducing the reactive power load at one of the load distribution substations. The voltage security processor 200 may be coupled to a device for increasing or decreasing reactive power outputs of some of the generators.

Figure 3:
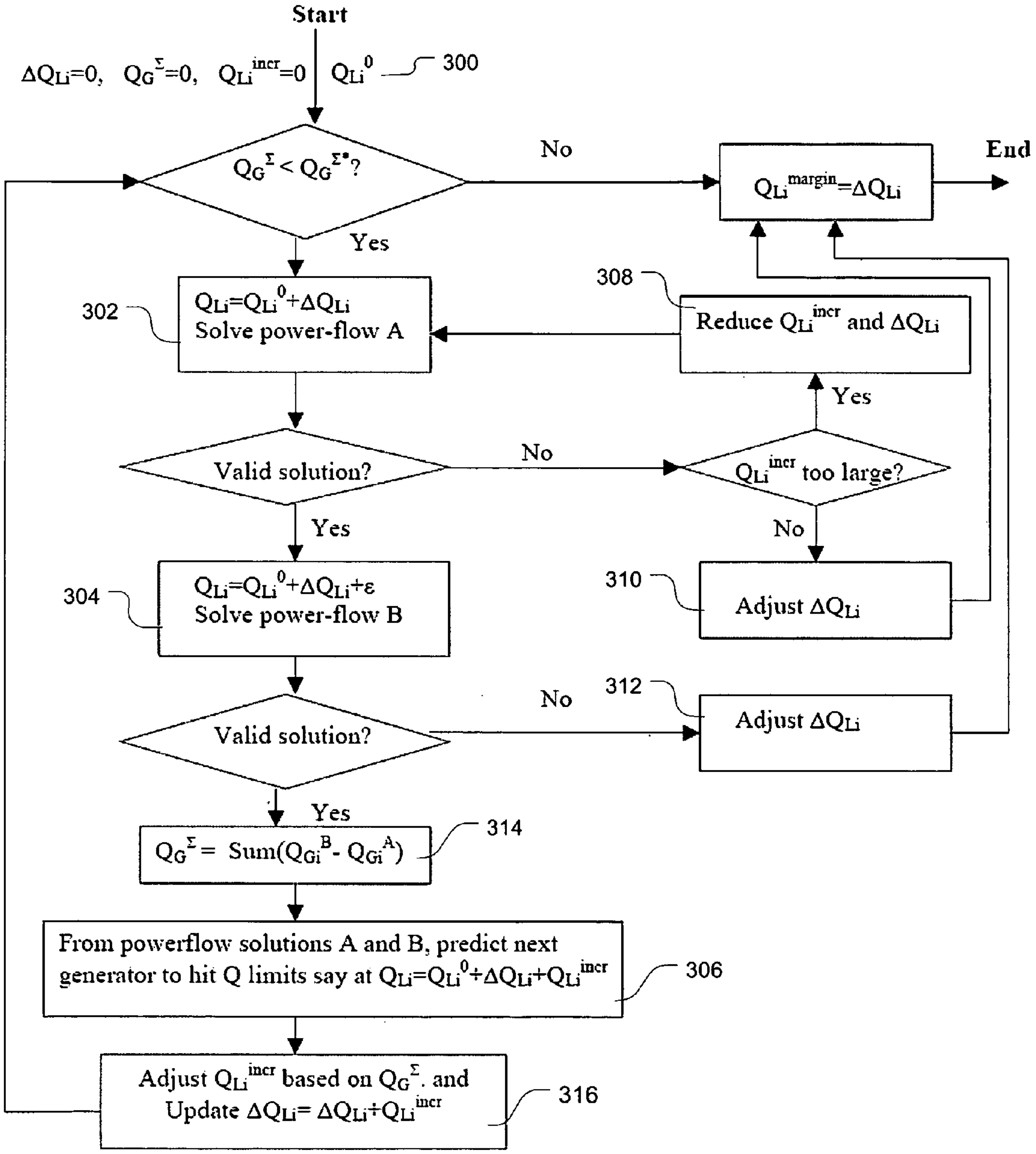
FIG. 3 is a flow chart illustrating instructions for a fast predictive QV margin calculator for use in the voltage security processor of FIG. 2.

FIG. 3 depicts an example of instructions that may be stored in the memory 212 of FIG. 2 which provides for a fast predictive QV margin calculator for assessing and monitoring voltage security in a power system in accordance with one aspect. The embodiment of FIG. 3 generally provides a method for computing QV margins rapidly by using a small number of repeated power-flow runs to estimate the QV margins by using a predictive approach. For example, in order to determine the QV margin at bus i, wherein the starting value for the reactive power load at bus i is $Q_{Li}^{0}$, the change of the reactive power load is assumed as being 0 ($\Delta Q_{Li}=0$) as shown at 300. The QV margin $Q_{Li}^{margin}$ at bus i is computed so that the load value of $Q_{Li}=Q_{Li}^{0}+Q_{Li}^{margin}$ will correspond to the static limit or the nose of the QV curve.

More specifically, the method provides that there are two power-flow solutions denoted Solution A and B at each iteration as shown at 302 and 304, respectively. Using the two solutions, the value of the reactive power load $Q_{Li}$ when the next generator is likely to cause all of the generators within the system to reach the combined operating limit of their reactive power output is computed or predicted as shown at 306. If one of the two power-flow solutions fails to converge in any step, the lack of existence of power-flow solution implies that the reactive power loading of $Q_{Li}$ is beyond the static limit and the limiting value is adjusted accordingly as shown at 308, 310, and 312. The flow of the iterations is controlled by a measure called $Q_G^{\Sigma}$, which is defined as the sensitivity of the net change in generation Q outputs to an incremental change in $Q_{Li}$. It is claimed that $Q_G^{\Sigma}$ stays near one for lightly loaded conditions and increases well above one when the system approaches static limits as shown at 314. Therefore, the value of $Q_G^{\Sigma}$ is used as a measure of proximity to the static limit in the method of FIG. 3. Accordingly, the method provides a computation of the values of $Q_{Li}^{margin}$ at each bus in the system without carrying out a continuum of large number of power-flow solutions.

The determination by the fast predictive calculator may be used to initiate specific control and/or monitoring actions as shown at 316. For example, a voltage security status alarm or voltage security control may be triggered in response thereto. In another example, suitable control measures may be initiated such as switching of transformer banks and/or capacitor/reactor banks, as well as shedding loads whenever necessary to mitigate an impending voltage stability problem. The reactive power load at one of the load distribution substations may be reduced. The reactive power outputs of some of the generators may be increased or decreased in response thereto.

Figure 4:
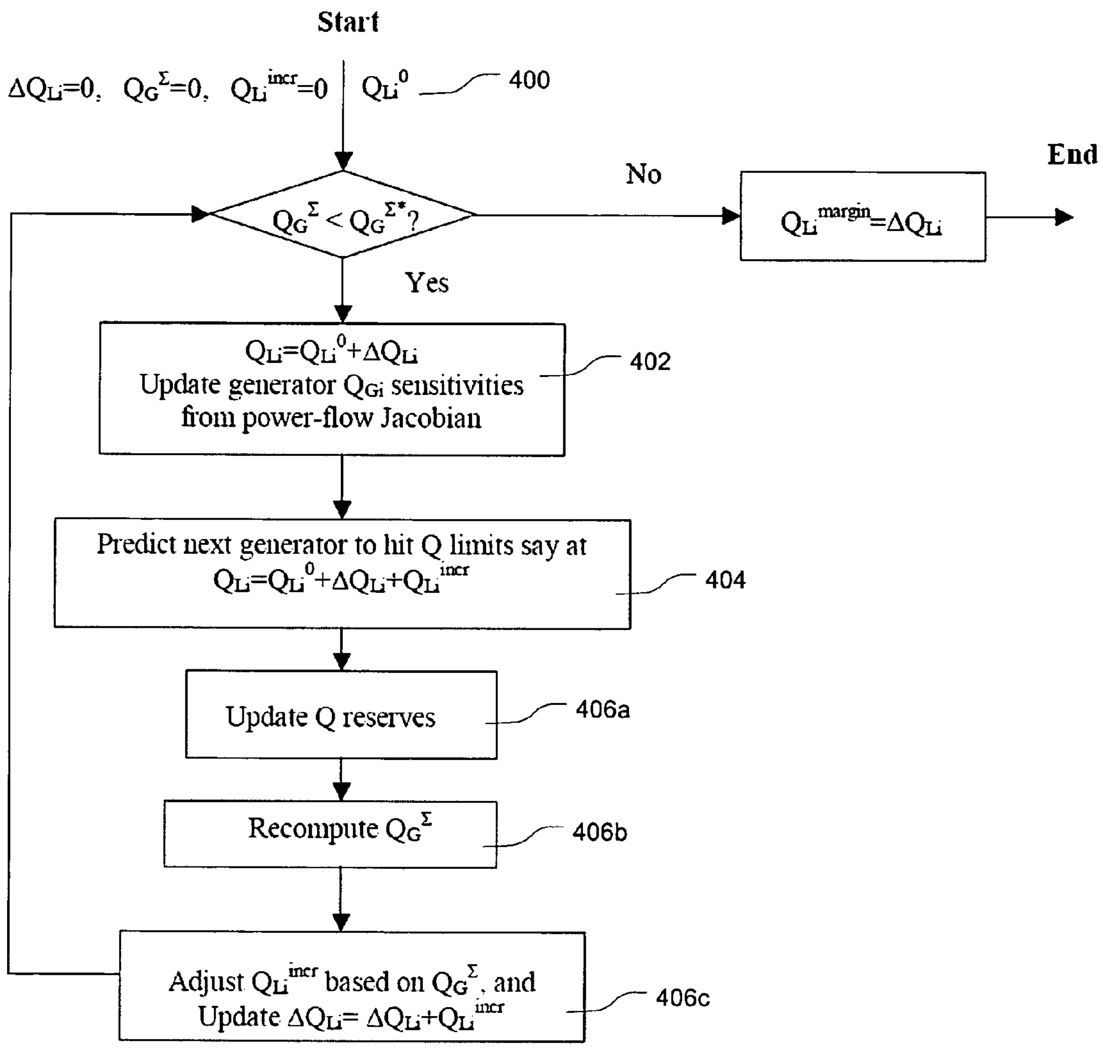
FIG. 4 is a flow chart illustrating instructions for a direct predictive QV margin calculator for use in the voltage security processor of FIG. 2.

FIG. 4 depicts another example of instructions that may be stored in the memory 212 of FIG. 2 which provides for a direct predictive QV margin calculator for assessing and monitoring voltage security in a power system. The embodiment of FIG. 4 generally provides a method for directly computing the value of the reactive power load $Q_{Li}$ when the next generator is likely to cause all of the generators within the system to reach the combined operating limit of their reactive power output is computed or predicted by processing the power-flow Jacobian matrix and the generator Q reserves.

For example, in order to determine the QV margin at bus i, wherein the starting value for the reactive power load at bus i is $Q_{Li}^0$, the change of the reactive power load is assumed as being 0 ($\Delta Q_{Li}=0$) as shown at 400. The QV margin $Q_{Li}^{margin}$ at bus i is computed so that the load value of $Q_{Li}=Q_{Li}^0+Q_{Li}^{margin}$ will correspond to the static limit or the nose of the QV curve as shown at 402.

In FIG. 3, the fast predictive method provides instructions for computing the generator reactive power $Q_{Gi}$ sensitivities to the $\epsilon$ change in $Q_{Li}$ by evaluating the two power-flow solutions A and B. In contrast, the direct predictive method of FIG. 4 avoids finding the two power-flow solutions A and B of FIG. 3 by directly computing the generator reactive power sensitivities $Q_{Gi}$ from the power-flow Jacobian as shown at 402. In FIG. 3, the entire computation uses the starting power-flow solution say x* and the initial full power-flow Jacobian evaluated at x*.

For example, the computation of the generator reactive power sensitivities from the power-flow Jacobian is as follows:

Suppose the state variables are represented as x where $$x = \begin{pmatrix} \delta_{PV} \\ \delta_{PQ} \\ V_{PV} \\ V_{PQ} \end{pmatrix} \quad \text{(A.1)}$$

The power-flow equations are then stated as $$\begin{pmatrix} p_{PV}(\delta_{PV}, \delta_{PQ}, V_{PQ}) \\ p_{PQ}(\delta_{PV}, \delta_{PQ}, V_{PQ}) \\ q_{PV}(\delta_{PV}, \delta_{PQ}, V_{PQ}) \\ q_{PQ}(\delta_{PV}, \delta_{PQ}, V_{PQ}) \end{pmatrix} - \begin{pmatrix} P_{PV} \\ P_{PQ} \\ Q_{PV} \\ Q_{PQ} \end{pmatrix} = \begin{pmatrix} 0 \\ 0 \\ 0 \\ 0 \end{pmatrix} \quad \text{(A.2)}$$

Suppose a power-flow solution to the equations (A.2) is represented as x*. Then, (A.2) at x* is linearized as follows.

$$\begin{pmatrix} \frac{\partial p_{PV}}{\partial \delta_{PV}} & \frac{\partial p_{PV}}{\partial \delta_{PQ}} & \frac{\partial p_{PV}}{\partial V_{PV}} & \frac{\partial p_{PV}}{\partial V_{PQ}} \\ \frac{\partial p_{PQ}}{\partial \delta_{PV}} & \frac{\partial p_{PQ}}{\partial \delta_{PQ}} & \frac{\partial p_{PQ}}{\partial V_{PV}} & \frac{\partial p_{PQ}}{\partial V_{PQ}} \\ \frac{\partial q_{PV}}{\partial \delta_{PV}} & \frac{\partial q_{PV}}{\partial \delta_{PQ}} & \frac{\partial q_{PV}}{\partial V_{PV}} & \frac{\partial q_{PV}}{\partial V_{PQ}} \\ \frac{\partial q_{PV}}{\partial \delta_{PV}} & \frac{\partial q_{PQ}}{\partial \delta_{PQ}} & \frac{\partial q_{PQ}}{\partial V_{PV}} & \frac{\partial q_{PV}}{\partial V_{PV}} \end{pmatrix}_{|(x^*)} \begin{pmatrix} \Delta\delta_{PV} \\ \Delta\delta_{PQ} \\ \Delta V_{PV} \\ \Delta V_{PQ} \end{pmatrix} - \begin{pmatrix} \Delta P_{PV} \\ \Delta P_{PQ} \\ \Delta Q_{PV} \\ \Delta Q_{PQ} \end{pmatrix} = \begin{pmatrix} 0 \\ 0 \\ 0 \\ 0 \end{pmatrix} \quad \text{(A.3)}$$

Next, it is assumed the effects from a small perturbation of $+\epsilon$ in $Q_{Li}$ on generator reactive power outputs $Q_{Gi}$ are computed. Assuming that $\epsilon$ is sufficiently small, the net effect on $Q_{Gi}$ from the load change $\Delta Q_{Li}=+\epsilon$ can be computed from linearized equations (A.3). First, note that $\Delta Q_{PQi}=-\epsilon$ and the remaining entries of $\Delta Q_{PQ}=0$. It is assumed that the active power loads do not change, which implies that $\Delta P_{PQ}=0$. Accordingly, it is also assumed that the active power generations do not change, and therefore, $\Delta P_{PV}=0$ as well. Moreover, by assumption, the PV buses remain constant which implies that $\Delta V_{PV}=0$. Based on the observations above, the changes in $\Delta Q_{PV}$ can then be calculated as follows:

$$\Delta Q_{PV} = \left(\frac{\partial q_{PV}}{\partial V_{PV}}\right)_{|(x^*)} \left(\frac{\partial q_{PQ}}{\partial V_{PQ}}\right)^{-1}_{|(x^*)} \Delta Q_{PQ} \quad \text{(A.4)}$$

In the implementation of the direct predictive method, it is assumed that the starting power-flow solution and the full Jacobian matrix in equation (A.3) at this power-flow solution are available at the beginning of the calculations. In each step in the method shown in FIG. 4, the method moves one generator bus from being a PV bus to a PQ bus by modifying the state vector x in (A.1) appropriately. The later computations for (A.4) are carried out by using the same power-flow solution values from x* and by using the appropriate entries of the original Jacobian matrix in (A.3) according to the structure of PV and PQ vectors at that time.

Next, in another embodiment, is it assumed that there are small perturbations in any of the real and reactive power loads, and there is a desire to compute the corresponding changes in generator real and reactive power outputs. That is, it is assumed that $\Delta P_{PQ}$ and $\Delta Q_{PQ}$ are specified and $\Delta P_{PV}$ and $\Delta Q_{PV}$ are to be computed. First, it is assumed that the changes $\Delta P_{PQ}$ are small in magnitude so that the corresponding changes in line losses can be ignored. Then, active power conservation implies that $$\sum_i \Delta P_{PQ_i} = \sum_i \Delta P_{PV_i} \quad \text{(A.5)}$$

The individual changes in $\Delta P_{PV_i}$ can then be computed from the sum of net active load power changes in (A.4) by using one of the standard assumptions: generator active power outputs change proportional to their active power capacities (governor power-flow assumption); active power outputs of a few specific "slack" generators pick up the net load power change (AGC power-flow assumption); and active power outputs of the generators are recomputed using some form of economic dispatch computations.

By assuming any one of the three formulations above, changes in the active power outputs of generators can be computed and hence, it can be assumed that $\Delta P_{PV}$ is known as well. The problem thus reduces to finding $\Delta Q_{PV}$, which can be solved from the Jacobian equation (A.3) by recognizing all the known quantities and by simple algebraic manipulations. Again, it is noted that $\Delta V_{PV}=0$ in (A.3), which allows us to solve the remaining state variable changes as follows.

$$\begin{pmatrix} \Delta\delta_{PV} \\ \Delta\delta_{PQ} \\ \Delta V_{PQ} \end{pmatrix} = \begin{pmatrix} \frac{\partial p_{PV}}{\partial \delta_{PV}} & \frac{\partial p_{PV}}{\partial \delta_{PQ}} & \frac{\partial p_{PV}}{\partial V_{PQ}} \\ \frac{\partial p_{PQ}}{\partial \delta_{PV}} & \frac{\partial p_{PQ}}{\partial \delta_{PQ}} & \frac{\partial p_{PQ}}{\partial V_{PQ}} \\ \frac{\partial q_{PQ}}{\partial \delta_{PV}} & \frac{\partial q_{PQ}}{\partial \delta_{PQ}} & \frac{\partial q_{PQ}}{\partial V_{PQ}} \end{pmatrix}^{-1}_{|(x^*)} \begin{pmatrix} \Delta P_{PV} \\ \Delta P_{PQ} \\ \Delta Q_{PQ} \end{pmatrix} \quad \text{(A.6)}$$

Next, $\Delta Q_{PV}$ can be solved as follows.

$$\Delta Q_{PV} = \left( \frac{\partial q_{PV}}{\partial \delta_{PV}} \quad \frac{\partial q_{PV}}{\partial \delta_{PQ}} \quad \frac{\partial q_{PV}}{\partial V_{PQ}} \right)_{|(x^*)} \begin{pmatrix} \Delta\delta_{PV} \\ \Delta\delta_{PQ} \\ \Delta V_{PQ} \end{pmatrix} \tag{A.7}$$

The embodiment of FIG. 4 therefore provides a method for directly computing the value of the reactive power load $Q_{Li}$ when the next generator is likely to cause all of the generators within the system to reach the combined operating limit of their reactive power output is computed or predicted by processing the power-flow Jacobian matrix and the generator Q reserves as shown at 404. Accordingly, this method provides a fast early warning type method for detecting the proximity to potential voltage instability phenomena so that suitable control measures may be initiated to mitigate the problem.

The determination by the direct predictive calculator may be used to initiate specific control and/or monitoring actions as shown at 406*a*, 406*b*, 406*c*. For example, a voltage security status alarm or voltage security control may be triggered in response thereto. In another example, suitable control measures may be initiated such as switching of transformer banks and/or capacitor/reactor banks, as well as shedding loads whenever necessary to mitigate an impending voltage stability problem. The reactive power load at one of the load distribution substations may be reduced. The reactive power outputs of some of the generators may be increased or decreased in response thereto.

While this invention has been described with reference to certain illustrative aspects, it will be understood that this description shall not be construed in a limiting sense. Rather, various changes and modifications can be made to the illustrative embodiments without departing from the true spirit, central characteristics and scope of the invention, including those combinations of features that are individually disclosed or claimed herein. Furthermore, it will be appreciated that any such changes and modifications will be recognized by those skilled in the art as an equivalent to one or more elements of the following claims, and shall be covered by such claims to the fullest extent permitted by law.

What is claimed is:

1. A device for assessing and monitoring voltage stability in an electrical power system including a plurality of generators and phasor measurement units, said phasor measurement units adapted to acquire and communicate phasor measurements from various locations on the power system, the device comprising:

a communications port adapted to receive the phasor measurements from the phasor measurement units, a predictive reactive power load limit calculator to calculate a reactive power loading margin where the plurality of generators will reach their respective and combined reactive power limits using a small number of power-flow runs, the calculator in communication with the communications port and receiving the phasor measurements, and the calculator adapted to:

calculate a predictive generator reactive power sensitivity indicating an anticipated change in generation reactive power output resulting from a predictive change in reactive power load at a specified reactive power load using the phasor measurements, wherein the magnitude of the sensitivity is related to the proximity to a static limit;

determine, based on the sensitivity, a load increment used for calculating the specified reactive power load for the next power-flow run, and, when the sensitivity is not less than a threshold, calculate the reactive power loading margin as a difference between the specified reactive power load and a current reactive power load.

2. The device of claim 1 further comprising an apparatus for reducing the reactive power load at one or more of the generators.

3. The device of claim 2 wherein the apparatus is a load shedding apparatus.

4. The device of claim 1 further comprising an apparatus for increasing or decreasing reactive power outputs of some of the generators.

5. The device of claim 1 further comprising an apparatus for accelerating the calculation processing of the predictive reactive power load limit calculator.

6. The device of claim 1 further including a generator reactive power sensitivity calculator.

7. The device of claim 6 wherein the generator reactive power sensitivity calculator is based at least in part on power-flow Jacobian.

8. The device of claim 1 further comprising an alarm coupled to the predictive reactive power load limit calculator adapted to indicate when a plurality of generators in the electrical power system have reached their combined maximum operating limit of providing reactive power.

9. The device of claim 1 further comprising a signaling circuit coupled to the predictive reactive power load limit calculator adapted to provide a signal representative of a control or monitoring action when a plurality of generators in the electrical power system have reached their combined maximum operating limit of providing reactive power.

10. The device of claim 1 wherein the communications port is adapted to receive Supervisory Control and Data Acquisition (SCADA) measurements, and the predictive reactive power load limit calculator is adapted to calculate a reactive power loading margin based in part on the SCADA measurements.

11. A method for assessing and monitoring voltage stability in an electrical power system including a plurality of generators, including the steps of:

a voltage security processor acquiring phasor or Supervisory Control and Data Acquisition (SCADA) measurements from various locations on the power system, calculating, using the voltage security processor, a reactive power loading margin where the plurality of generators will reach their respective and combined reactive power limits using a small number power-flow runs, at least one power-flow run comprising:

calculating a predictive generator reactive power sensitivity indicating an anticipated change in generation reactive power output resulting from a predictive change in reactive power load at a specified reactive power load using the measurements, wherein the magnitude of the sensitivity is related to the proximity to a static limit, determining, based on the sensitivity, a load increment used for calculating the specified reactive power load for the next power-flow run, and, when the sensitivity is not less than a threshold, calculating the reactive power loading margin as a difference between the specified reactive power load and a current reactive power load.

12. The method of claim 11 further comprising the step of reducing the reactive power load at one or more of the generators.

13. The method of claim 11 further comprising the step of increasing the reactive power outputs of some of the generators.

14. The method of claim 11 further comprising the step of decreasing the reactive power outputs of some of the generators.

15. The method of claim 11 wherein the generator reactive power sensitivity is calculated based at least in part on power-flow Jacobian.

16. The method of claim 11 further comprising the step of signaling an alarm to indicate when a plurality of generators in the electrical power system have reached their combined maximum operating limit of providing reactive power.

17. The method of claim 11, wherein the step of calculating a predictive generator reactive power sensitivity comprises evaluating a power-flow solution.

18. The device of claim 1, wherein the predictive reactive power load limit calculator is adapted to calculate a predictive generator reactive power sensitivity by evaluating a power-flow solution.

19. The device of claim 1, wherein the predictive reactive power load limit calculator is adapted to calculate a predictive generator reactive power sensitivity at a particular bus by evaluating a number of power flow solutions.

20. The method of claim 11, wherein the step of calculating a predictive generator reactive power sensitivity comprises calculating the sensitivity at a particular bus by evaluating a number of power flow solutions.

21. The device of claim 19, wherein the reactive power loading margin comprises a reactive power loading margin at the particular bus calculated as a difference between the reactive power load at the particular bus and the predictive change in reactive power load at the particular bus when the next generator will cause the plurality of generators to reach a combined reactive power operating limit.

22. The method of claim 20, wherein the reactive power loading margin comprises a reactive power loading margin at the particular bus, and the step of calculating the reactive power loading margin comprises calculating as a difference between the reactive power load at the particular bus and the predictive change in reactive power load at the particular bus when the next generator will cause the plurality of generators to reach a combined reactive power operating limit.

23. The device of claim 1, wherein the static limit comprises a nose of a QV curve.

24. The method of claim 11, wherein the static limit comprises a nose of a QV curve.

25. The device of claim 1, wherein the calculator is further adapted to calculate a plurality of power-flow solutions at a plurality of different reactive power loads, and wherein the sensitivity is calculated based on the incremental difference between a second reactive power generated at a second of the plurality of different reactive power loads and a first reactive power generated at a first of the plurality of different reactive power loads.

26. The device of claim 1, wherein the calculator is adapted to directly calculate the sensitivity when it is assumed only reactive power load is changing using a sensitivity equation:

$$\Delta Q_{PV} = \left(\frac{\partial q_{PV}}{\partial V_{PV}}\right)_{|x^*} \left(\frac{\partial q_{PQ}}{\partial V_{PQ}}\right)_{|x^*}^{-1} \Delta Q_{PQ}$$

wherein $\Delta Q_{PV}$ is the anticipated change in the generation reactive power output for a plurality of reactive power source buses, $\Delta Q_{PQ}$ is the predictive change in the reactive power load for a plurality of reactive power sink buses, $q_{PV}$ is a plurality of generation instantaneous reactive power values, $V_{PV}$ is a plurality of bus terminal voltage magnitudes corresponding to the plurality of reactive power source buses, $q_{PQ}$ is a plurality of load instantaneous reactive power values, $V_{PQ}$ is a plurality of bus terminal voltage magnitudes corresponding to the plurality of reactive power sink buses, the exponent (−1) represents an inverse, ∂ indicates a partial derivative, and x* is a power flow solution, and wherein the sensitivity equation is solved using a linearized power-flow equation, the linearized power-flow equation comprising a power-flow Jacobian matrix at a power-flow solution multiplied by a change in state variables minus a change in the power flow solution.

27. The device of claim 1, wherein the calculator is adapted to directly calculate the sensitivity when real and reactive load powers are changing using a first sensitivity equation:

$$\Delta Q_{PV} = \left(\frac{\partial q_{PV}}{\partial \delta_{PV}} \; \frac{\partial q_{PV}}{\partial \delta_{PQ}} \; \frac{\partial q_{PV}}{\partial V_{PQ}}\right)_{|(x^*)} \begin{pmatrix} \Delta\delta_{PV} \\ \Delta\delta_{PQ} \\ \Delta V_{PQ} \end{pmatrix}$$

wherein $\Delta Q_{PV}$ is the anticipated change in the generation reactive power output for a plurality of reactive power source buses, $q_{PV}$ is a plurality of generation instantaneous reactive power values, $\delta_{PV}$ is a plurality of bus terminal voltage phase angles corresponding to the plurality of reactive power source buses, $\delta_{PQ}$ is a plurality of bus terminal voltage phase angles corresponding to a plurality of reactive power sink buses, $V_{PQ}$ is a plurality of bus terminal voltage magnitudes corresponding to the plurality of reactive power sink buses, Δ denotes change of a quantity, ∂ indicates a partial derivative, and x* is a power flow solution, and a second sensitivity equation:

$$\begin{pmatrix} \Delta\delta_{PV} \\ \Delta\delta_{PQ} \\ \Delta V_{PQ} \end{pmatrix} = \begin{pmatrix} \frac{\partial p_{PV}}{\partial \delta_{PV}} & \frac{\partial p_{PV}}{\partial \delta_{PQ}} & \frac{\partial p_{PV}}{\partial V_{PQ}} \\ \frac{\partial p_{PQ}}{\partial \delta_{PV}} & \frac{\partial p_{PQ}}{\partial \delta_{PQ}} & \frac{\partial p_{PQ}}{\partial V_{PQ}} \\ \frac{\partial q_{PQ}}{\partial \delta_{PV}} & \frac{\partial q_{PQ}}{\partial \delta_{PQ}} & \frac{\partial q_{PQ}}{\partial V_{PQ}} \end{pmatrix}_{|(x^*)}^{-1} \begin{pmatrix} \Delta P_{PV} \\ \Delta P_{PQ} \\ \Delta Q_{PQ} \end{pmatrix}$$

wherein $p_{PV}$ is a plurality of generation instantaneous real power values, $p_{PQ}$ is a plurality of load instantaneous real power values, $q_{PQ}$ is a plurality of load instantaneous reactive power values, the exponent (−1) represents an inverse, $P_{PV}$ is a plurality of generation active power outputs, $P_{PQ}$ is a plurality of active power loads, and $Q_{PQ}$ is the reactive power load for the plurality of reactive power sink buses, and wherein the first and second sensitivity equations are solved using a linearized power-flow equation, the linearized power-flow equation comprising a power-flow Jacobian matrix at a power-flow solution multiplied by a change in state variables minus a change in the power flow solution.

* * * * *